(12) United States Patent
Chi et al.

(10) Patent No.: US 7,633,110 B2
(45) Date of Patent: Dec. 15, 2009

(54) MEMORY CELL

(75) Inventors: Min-Hwa Chi, Hsin-Chu (TW);
Wen-Chuan Chiang, Hsin-chu (TW);
Cheng-Ku Chen, Hsin-chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 255 days.

(21) Appl. No.: 10/945,762

(22) Filed: Sep. 21, 2004

(65) Prior Publication Data

US 2006/0060909 A1 Mar. 23, 2006

(51) Int. Cl.
*H01L 27/108* (2006.01)

(52) U.S. Cl. ........................ 257/301; 438/243

(58) Field of Classification Search ............. 257/296, 257/301, 330, E27.084, E27.092, E27.093, 257/303; 438/243
See application file for complete search history.

(56) References Cited

U.S. PATENT DOCUMENTS

| | | | |
|---|---|---|---|
| 4,679,300 A * | 7/1987 | Chan et al. ............... | 438/246 |
| 4,728,623 A * | 3/1988 | Lu et al. ................... | 438/245 |
| 5,057,888 A * | 10/1991 | Fazan et al. .............. | 257/303 |
| 5,225,697 A * | 7/1993 | Malhi et al. ............... | 257/302 |
| 5,548,145 A * | 8/1996 | Hamamoto et al. ........ | 257/301 |
| 5,945,704 A * | 8/1999 | Schrems et al. ........... | 257/301 |
| 6,143,604 A | 11/2000 | Dhiang et al. | |
| 6,165,839 A | 12/2000 | Lee et al. | |
| 6,168,984 B1 | 1/2001 | Yoo et al. | |
| 6,168,989 B1 | 1/2001 | Chiang et al. | |
| 6,174,770 B1 | 1/2001 | Chi | |
| 6,174,802 B1 | 1/2001 | Haung et al. | |
| 6,187,659 B1 | 2/2001 | Ying et al. | |
| 6,194,234 B1 | 2/2001 | Huang et al. | |
| 6,214,715 B1 | 4/2001 | Huang et al. | |
| 6,227,211 B1 | 5/2001 | Yang et al. | |
| 6,235,580 B1 | 5/2001 | Lee et al. | |
| 6,262,447 B1 | 7/2001 | Chi | |
| 6,271,084 B1 | 8/2001 | Tu et al. | |
| 6,271,125 B1 | 8/2001 | Yoo et al. | |
| 6,306,767 B1 | 10/2001 | Tzeng et al. | |

(Continued)

OTHER PUBLICATIONS

Itoh et al., Reviews and Prospects of High-Density RAM Technology, IEEE, 2000, pp. 13-22.

(Continued)

*Primary Examiner*—David Vu
(74) *Attorney, Agent, or Firm*—Baker & McKenzie LLP

(57) ABSTRACT

Disclosed herein is a DRAM memory cell featuring a reduced size, increased retention time, and compatibility with standard logic manufacturing processes, making it well-suited for use as embedded DRAM. The memory cell disclosed herein includes a pass-gate transistor and a storage region. The transistor includes a gate and a drain. The storage region includes a trench, which is preferably a Shallow Trench Isolation (STI). A non-insulating structure, e.g., formed of polysilicon or metal, is located in the trench as serves as a capacitor node. The trench is partially defined by a doped sidewall that serves as a source for the transistor. The poly structure and the trench sidewall are separated by a dielectric layer. The write operation involves charge transport to the non-insulating structure by direct tunneling through the dielectric layer. The read operation is assisted by Gate Induced Drain Leakage (GIDL) current generated on the surface of the sidewall.

17 Claims, 17 Drawing Sheets

U.S. PATENT DOCUMENTS

| | | | |
|---|---|---|---|
| 6,362,012 | B1 | 3/2002 | Chi et al. |
| 6,376,294 | B1 | 4/2002 | Tzeng et al. |
| 6,403,416 | B1 | 6/2002 | Huang et al. |
| 6,429,068 | B1 | 8/2002 | Divakarumi et al. |
| 6,486,025 | B1 | 11/2002 | Liu et al. |
| 6,486,529 | B2 | 11/2002 | Chi et al. |
| 6,500,706 | B1 | 12/2002 | Chi |
| 6,501,120 | B1 | 12/2002 | Tu et al. |
| 6,518,594 | B1 | 2/2003 | Nakajima et al. |
| 6,528,366 | B1 | 3/2003 | Tu et al. |
| 6,538,287 | B2 | 3/2003 | Wang et al. |
| 6,661,043 | B1 | 12/2003 | Huang et al. |
| 6,727,540 | B2 * | 4/2004 | Divakaruni et al. ......... 257/301 |
| 2004/0009646 | A1 | 1/2004 | Lin et al. |
| 2004/0063300 | A1 | 4/2004 | Chi et al. |

OTHER PUBLICATIONS

Lindert et al., Comparison of GIDL in p+-poly PMOS and n+—poly PMOS Devices, IEEE Electron Device Letters, Jun. 1996, pp. 285-287, vol. 17, No. 6.

She et al., Silicon-Nitride as a Tunnel Dielectric for Improved SONOS-Type Flash Memory, IEEE Electronic Device Letters, May 2003, pp. 309-311, vol. 24, No. 5.

Govoreanu et el., Variot: A Novel Multilayer Tunnel Barrier Concept for Low-Voltage Nonvolatile Memory Devices, IEEE Electron Device Letters, Feb. 2003, pp. 99-101, vol. 24, No. 2.

Lee et al., Theoretical and Experimental Investigation of Si Noncrystal Memory Device With HfO2 High-k Tunneling Dielectric, IEEE Transactions on Electron Devices, Oct. 2003, pp. 2067-2072, vol. 50, No. 10.

Zengtao et al., Metal Nancrystal Memories—Part I: Device Design and Fabrication, IEEE Transactions on Electron Devices, Sep. 2002, pp. 1606-1613, vol. 49, No. 9.

Itoh, Low-Voltage Memories for Power-Aware Systems, k-itoh@crl.hitachi.co.jp, pp. 1-6.

Chung et al., New Technologies in Isolation and Capacitor Process for sub 0.1 DRAM device, IEEE, 2003, pp. 17-24.

Keitel-Schultz et al., Embedded DRAM Development: Technology, Physical Design, and Application Issues, IEEE, May-Jun. 2001, pp. 7-15.

Yanagiya et al., 65nm CMOS Technology (CMOS5) with High Density Embedded Memories for Broadband Microprocessor Applications, IEEE, 2002, pp. 57-60.

Mazoyer et al., MIM HfO2 Low Leakage Capacitors for eDRAM Integration at Interconnect Levels, IEEE, 2003, pp. 117-119.

Leung et al., The Ideal SoC Memory: 1T-SRAM, IEEE, 2000, pp. 32-36.

Lee, Modeling CMOS Tunneling Currents Through Ultrathin Gate Oxide Due to Conduction-and-Valence-Band Electron and Hole Tunneling, IEEE Transactions on Electron Devices, Jul. 2001, pp. 1366-1373, vol. 48, No. 7.

Parkinson et al., Novel Techniques for Scaling Deep Trench DRAM Capacitor Technology to 0.11 um and Beyond, IEEE, 2003, pp. 21-24.

* cited by examiner

MEMORY CELL

TECHNICAL FIELD

This invention relates to electronic memory devices, particularly dynamic random access (DRAM) devices.

BACKGROUND

Dynamic Random Access Memory (DRAM) is a type of semiconductor memory widely used for storage of electronic data. Known implementations of DRAM include commodity DRAM and embedded DRAM (eDRAM).

Commodity DRAM refers to discrete, stand-alone memory devices that communicate with logic devices via a system bus. Recent advances in commodity DRAM technology include area-optimized one-transistor (1T) technology, which refers to DRAM having memory cells that include a single-transistor and a single capacitor. In present state-of-the-art DRAM technology, 1T memory cells are fabricated with the cell capacitor either stacked high above the transistor (before interconnect formation) or in a deep trench (before transistor formation), requiring increasingly challenging process technology. The complexity of cell fabrication, particularly for these types of cells, has resulted in the implementation of specialized fabrication processes and dedicated tools for DRAM fabrication that are not compatible with standard CMOS fabrication. See, e.g., Doris Keitel-Schulz & Norbert Wehn, *Embedded DRAM Development: Technology, Physical Design, and Application Issues,* IEEE DESIGN AND TEST OF COMPUTERS, May-June 2001, at 7-15.

In recent years, there has been a drive towards the development of single-chip devices that include large blocks of embedded memory. This has resulted in the development of logic devices that include eDRAM. Examples of such devices include Application-Specific Integrated Circuits (ASIC) and System-on-Chip (SoC) devices. It has been recognized that embedding memory into a logic device eliminates latency due to signal transfer via a system bus, thereby yielding substantial improvements in system performance. As a result, development of such devices is currently being aggressively pursued in order to meet the ever increasing performance demands, such as increased system speed and decreased power consumption. The relatively small size of a DRAM cell, for example as compared to a typical SRAM cell that can be an order of magnitude greater in size, makes eDRAM an attractive option for providing high-density embedded memory. In addition, integrating eDRAM even in small amounts (e.g., 4 to 32 Mb) into logic circuits can result in significant improvement in system speed and cost. However, implementing eDRAM is not a trivial task. If fabrication of a typical memory cell capacitor of a commodity DRAM is simply added into a standard CMOS logic fabrication process, both CMOS logic and DRAM suffer degraded performance (e.g., due to added thermal cycles, topology, incompatible and non-optimized process steps) and increased processing costs.

Therefore, several approaches have been proposed for implementing eDRAM into logic devices with minimal alteration to CMOS logic transistor characteristics. One such approach is the use of a DRAM deep trench capacitor cell, where cells are fabricated before transistor formation. This way, the thermal cycles used for DRAM capacitor formation do not impact the structures associated with the CMOS transistors. This approach is discussed in greater detail in Narutoshi Yanagiya et al., *65 nm CMOS Technology (CMOS5) with High Density Embedded Memories for Broadband Microprocessor Applications,* 2002 INT'L ELECTRON DEVICES MEETING 57-60. While this approach offers small cell size and high density memory, there remain adverse effects to associated logic circuitry (e.g., stress around DRAM area for abnormal dopant diffusion and junction leakage, lower yield, reliability concerns, etc.).

Another approach is the use of DRAM cells that have a metal-insulator-metal (MIM) capacitor that is fabricated after logic transistors are formed. Fabrication of a MIM capacitor can be accomplished at low enough process temperatures (e.g., less than 450 C.) that the performance of the logic devices is not significantly degraded. This approach offers competitive cell size (only slightly larger than a comparable deep trench cell) and full compatibility with standard CMOS logic with relatively little extra cost. This approach offers some promise, but at present remains largely in development for 90 nm technologies and beyond.

Yet another approach is the use of DRAM cells that have a planar capacitors (between the well and gate-poly) that are implemented using a MOS structure. An example of this technology is discussed in Wingyu Leung et al., *The Ideal SoC Memory: 1T-SRAM™,* 2000 PROC. 13$^{TH}$ ANNUAL IEEE INT'L ASIC/SOC CONF. 32-36. This approach represents a compromise between cell size (about 10× larger than a trench cell) and smaller capacitance (approximately 5 fF per cell) with no additional costs beyond that of standard logic CMOS fabrication processing. This approach has been found to be advantageous for special SOC applications, e.g., using less bits per bit-line, multi-banking techniques, and mimicking of SRAM I/O to allow for replacing SRAM on a chip. However, this approach is not considered suitable for much larger memory density (e.g., >8 Mb) due to the larger cell size.

SUMMARY

Disclosed is a DRAM memory cell having a structure that is particularly well-suited for use as embedded DRAM. The described embodiments provide for reduced size, increased retention time, and increased compatibility with standard logic manufacturing processes. The disclosed embodiments, however, can also be used in DRAMs outside the embedded DRAM context, and the claims of this application should not be limited excepted according to the claim language.

In disclosed embodiments, the memory cell disclosed herein includes a poly structure that serves as a floating-poly capacitor and a pass-gate transistor. The pass-gate transistor includes a gate structure and a drain junction. The poly structure is provided in a trench, preferably a Shallow Trench Isolation (STI). The trench is partially defined by a doped sidewall that wraps around the poly structure and serves as a source junction for the pass-gate transistor. The poly structure and the trench sidewall are separated by a layer of dielectric material. Charge transport to the poly structure (capacitor) is accomplished by direct tunneling through the dielectric layer from the trench sidewall during accumulation as induced by an electric field of an adjacent gate bias of the pass-gate transistor. Retention time is increased due to isolation of the poly structure (capacitor node) from the sidewall by the dielectric layer during depletion, where a negative bias is present on the adjacent gate of the pass-gate transistor. The read operation is assisted by Gate Induced Drain Leakage (GIDL) current as generated on the surface of the sidewall.

Other disclosed embodiments include a pair of adjacent DRAM memory cells that share a single, common trench, thereby further reducing the effective cell size. More specifically, a poly structure for each of the memory cells is provided in a single trench. Dielectric material is used to electrically isolate the two poly structures.

BRIEF DESCRIPTION OF THE DRAWINGS

The present invention is illustrated by way of example and is not limited by the figures of the accompanying drawings, in which like reference numbers indicate similar parts.

DETAILED DESCRIPTION

Figure 1:
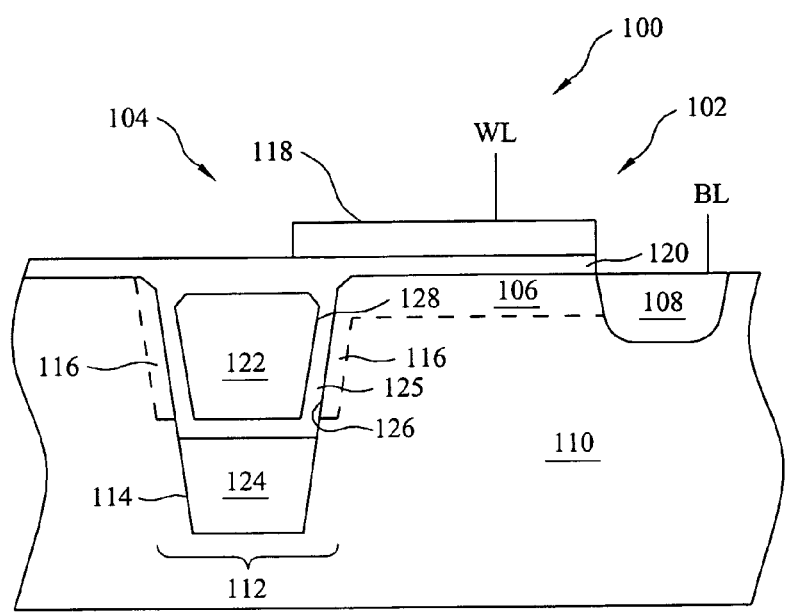
FIG. 1 shows a schematic cross-sectional view of a first embodiment of a DRAM memory cell.

FIG. 1 shows a schematic cross-sectional view of a DRAM memory cell 100 of the present invention. The memory cell 100 includes an NMOS pass-gate transistor 102 and a storage region 104. The transistor 102 includes an implanted n-type channel 106 and an n$^+$ drain junction 108 formed in a p-type semiconductor substrate 110 (e.g., p-type silicon wafer with <100> crystal surface). The transistor 102 also includes an n$^+$ poly gate structure 118 and a gate-oxide layer 120 provided over an upper surface of the substrate 110. The source of the transistor 102 is comprised within the elements of the storage region 104 as described below.

The storage region 104 includes an isolation region 112 (e.g., a partially recessed shallow trench isolation (STI)). The isolation region 112 includes a trench 114 formed in the substrate 110. A p$^+$ poly (polysilicon) structure 122 is provided over an insulating layer 124 in the trench 114. The insulating layer 124 comprises silicon oxide, silicon nitride, silicon oxynitride or combinations thereof. Preferably the insulating layer 124 silicon oxide is formed by plasma enhanced chemical vapor deposition. An n-type implanted sidewall 116 circumscribes the poly structure 122, but is separated from the poly structure 122 by a dielectric layer 125. The implanted sidewall 116 serves as the source junction of the transistor 102. An inner surface 126 of the sidewall 116 faces a side surface 128 of the poly structure 122 and partially defines the trench 114. The sidewall 116 is preferably implanted with phosphorus P31 to have a high enough impurity concentration, such as a concentration level typical in a drain extension of a Large-Angle Tilt Implanted Drain (LATID) structure, for example in a range of $1\times10^{16}$ atoms/cm$^3$ to $1\times10^{20}$ atoms/cm$^3$.

A dielectric layer 125 is provided between the poly structure 122 and the sidewall 116. The dielectric layer 125 is essentially a "tunnel oxide" that preferably is thin enough (e.g., <15 Å) to allow for large direct-tunneling current during write operations (described below). Further, the implanting of the sidewall 116 with n-type impurities results in enhanced Gate Induced Drain Leakage (GIDL) current being induced on the surface 126 of the sidewall 116 by the potential of the p$^+$ poly structure 122 during read operations (described below).

In a preferred embodiment, the dielectric layer 125 is composed of silicon dioxide (SiO$_2$). In other embodiments, a high-k dielectric (e.g., featuring dielectric constant k>3.9) can be used for the dielectric layer 125. Examples of preferable high-k dielectric materials that can be used include silicon nitride (Si$_3$N$_4$), alumina (Al$_2$O$_3$), haffnium oxide (HfO$_2$), although it is contemplated that the use of other dielectrics is possible (e.g., depending on thermal stability requirements) such as hafnium silicate (HfSiO$_4$), zirconium oxide (ZrO$_2$), zirconium silicate (ZrSiO$_4$), tantalum pentoxide (Ta$_2$O$_5$), lanthanum oxide (La$_2$O$_3$), gadolinium oxide (Gd$_3$O$_3$), yttrium oxide (Y$_2$O$_3$), and strontium titanate (SrTiO$_3$).

Embodiments of the memory cell 100 can be implemented based on standard design rules and process parameters associated with typical CMOS 90 nm generation technology. For example, the gate-oxide layer 120 can have a thickness of 50 angstroms (Å) for 2.5 volt (v) operations, 36 Å for 1.8v operations, and 15 Å for 1.0 v operations. Typically, for 90 nm technology, I/O and analog circuitry utilizes 2.5 v and 1.8 v transistors, and logic utilizes 1.0 v transistors. For convenience, 1.0 v, 1.8 v, and 2.5 v are referred to herein as $V_{cc}$, $V_{dd1}$, and $V_{dd2}$, respectively. Furthermore, the voltage sources of 1.0 v ($V_{cc}$) and 1.8 v ($V_{dd1}$) can be generated on-chip from an external 2.5 v ($V_{dd2}$) voltage source. It will, however, be appreciated that the memory cell 100 can be used in other applications, including 65 nm CMOS generation and beyond with lower $V_{cc}$, $V_{dd1}$, and $V_{dd2}$.

Figure 2:
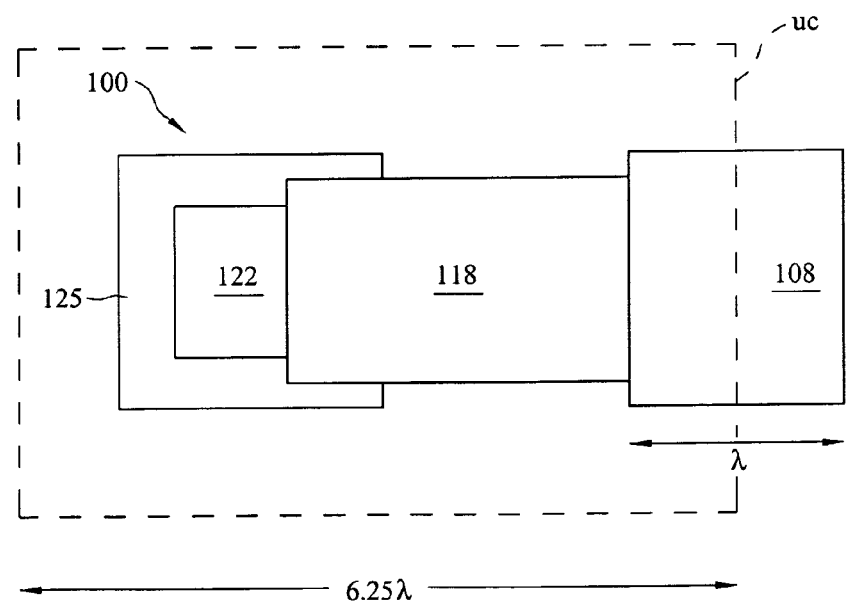
FIG. 2 shows a plan view of the memory cell shown in FIG. 1.

FIG. 2 shows a plan view of the memory cell 100. The layout of the memory cell 100 has a unit cell area of 6.25λ$^2$, (compared to conventional 8.0λ$^2$), where λ is the minimum lithography dimension. The smaller size of the cell is enabled by the source (sidewall 116) of the pass transistor 102 being vertically wrapped about the floating poly structure 122 as shown and described above.

A write operation of the memory cell 100 will now be discussed in connection with FIGS. 3A-3B. During a write operation, the n$^+$ drain junction 108 of the pass transistor 102 is biased to high 1.8 v ($V_{dd1}$) or to low 0 v or more negative for logic states "1" or "0", respectively, through bit-line circuitry (not shown). The pass transistor 102 is switched "on" by biasing the gate 118 to 2.5 v ($V_{dd2}$), so that the n-type channel 106 is in strong accumulation (of electrons) and thereby shorted to the n$^+$ drain junction 108. The pass transistor 102 is switched "off" by biasing the gate 118 to –0.7 v so that the n-type channel 106 is in depletion. As described above, the pass transistor 102 is an enhancement mode device that is "on" when the gate voltage is "1" due to the implantation of n-type impurities in the channel 106.

Figure 3A:
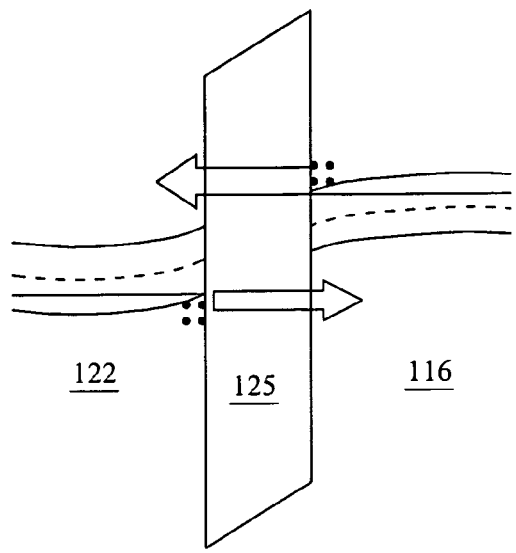
FIGS. 3A and 3B show energy band diagrams associated with a write operation of the memory cell shown in FIG. 1.

A band diagram corresponding to an operation for writing logic state "0" to the memory cell 100 is illustrated in FIG. 3A. The drain junction 108 (or bit-line) is biased at 0 v. The potential of the poly structure 122 will be pulled down close to 0 v by electron tunneling from the inner surface 126 of the sidewall 116 and the n-type channel 106 (in accumulation) towards the conduction band of the side surface 128 of the p$^+$ poly structure 122 (in accumulation). There is also hole tunneling from the side surface 128 of the p$^+$ poly structure 122 towards the n-type sidewall 116, but at a much smaller rate (e.g., at least >2 orders of magnitude smaller) than the electron tunneling.

Figure 3B:
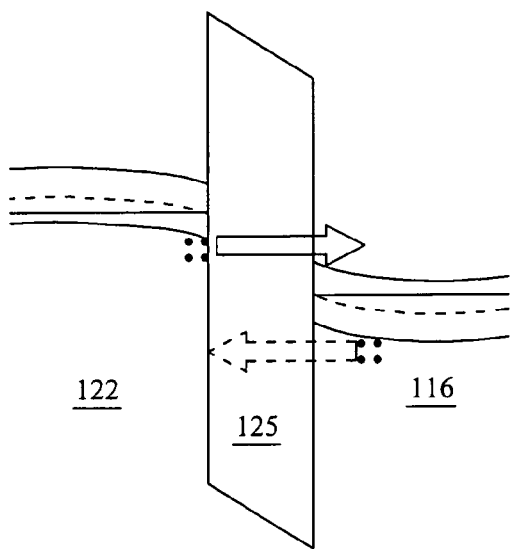

A band diagram corresponding to an operation for writing logic state "1" to the memory cell 100 is illustrated in FIG. 3B. The drain junction 108 (or bit line) is biased at 1.8 v. The potential of the poly structure 122 will be pulled up close to 1.8 v by electron direct-tunneling from the valence band of the side surface 128 of the p+ poly structure 122 (in depletion) towards the n-type sidewall 116 (and channel 106). The inner surface 126 of the sidewall 116 is in depletion (i.e., never entering into hole inversion due to the electrical field from the +2.5 v pass-gate bias). Therefore, while there will be substantial tunneling of electrons from the poly structure 122 to the sidewall 116 and channel 106, there will be negligible hole tunneling from the sidewall 116 towards the p+ poly structure 122.

The "0" write process described above will result in electrons being stored on the poly structure 122. The "1" write process described above will, on the other hand, result in a depletion of electrons from the poly structure 122. This difference in electron presence on the poly structure 122 can be sensed according to the read process described below.

The write operations described above can be completed within nanoseconds (e.g., <100 ns) for most practical applications. Using methods known in the art, the electron current density of the conduction band can be estimated as larger than $10^2$-$10^4$ A/cm$^2$ with 0.5 v-1.5 v across the dielectric layer 125. For example, a method of arriving at this estimate is discussed in Wen-Chin Lee & Chenming Hu, *Modeling CMOS Tunneling Currents Through Ultrathin Gate Oxide Due to Conduction- and Valence-Band Electron and Hole Tunneling*, 48 IEEE TRANS. ELEC. DEVICES 1366-1373 (2001). Considering that the total capacitance of the poly structure 122 can be on the order of approximately 1 fF, the write "0" operation can be completed (within 0.5 v) within 10 ns. With a dielectric layer 125 thinner than 15 Å, the amount of direct-tunneling electrons from the conduction band (CB) is larger than the amount of electrons tunneling from the valence band (VB) by approximately 10×, thus the write "0" operation is faster than the write "1" operation by approximately 10×.

A read operation of the memory cell 100 will now be discussed in connection with FIGS. 4A-4B. The read operation of the memory cell 100 is assisted by Gate-Induced Drain Leakage (GIDL) as illustrated. The pass transistor 102 is switched "on" by biasing the gate 118 to 2.5 v ($V_{dd2}$), so that the n-type channel 106 is in strong accumulation (of electrons) and shorted to the n+ drain junction 108. The drain junction 108 can be biased at 1.2 v (i.e., $V_{dd2}$/2). The potential of the poly structure 122 will induce and modulate the magnitude of holes generated on the inner surface 126 of the sidewall 116 and flowing into the p-type substrate 110 as (hole) GIDL current. The p+ poly structure 122 (e.g., as opposed to an n+ poly structure) is more capable of generating a GIDL current on the n-type sidewall 116 due to the increased built-in field across the dielectric layer 125 caused by the Fermi-level difference. Thus, when the poly structure 122 is at a low potential of approximately 0 v (i.e., read "0" operation), the (hole) GIDL current is large. Conversely, when the poly structure 122 is at a high potential of approximately 1.8 v (i.e., read "1" operation), the GIDL is negligible. The read "0" operation is destructive, and the potential of the poly structure 122 will be pulled towards 1.2 v ($V_{dd2}$/2). Therefore, there is a need for a "write back '0'" operation similar to that performed in conventional DRAM cell operation. The read "1" operation, on the other hand, does not require write-back since there is no disturbance during the read "1" operation.

Figure 4A:
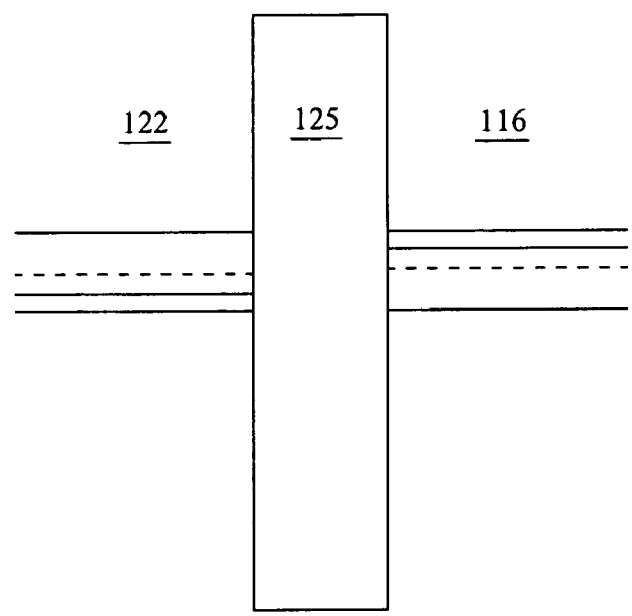
FIGS. 4A and 4B show energy band diagrams associated with a read operation of the memory cell shown in FIG. 1.

Thus, as illustrated in FIG. 4A, for a read "1" operation the inner surface 126 of the sidewall 116 and the side surface 128 of the poly structure 122 are close to flat-band. Thus, there exists only negligible direct tunneling of electrons or holes across the dielectric layer 125. The drain junction 108 (or bit line, not shown) therefore senses a significantly small junction leakage, which is interpreted as a "1".

Figure 4B:
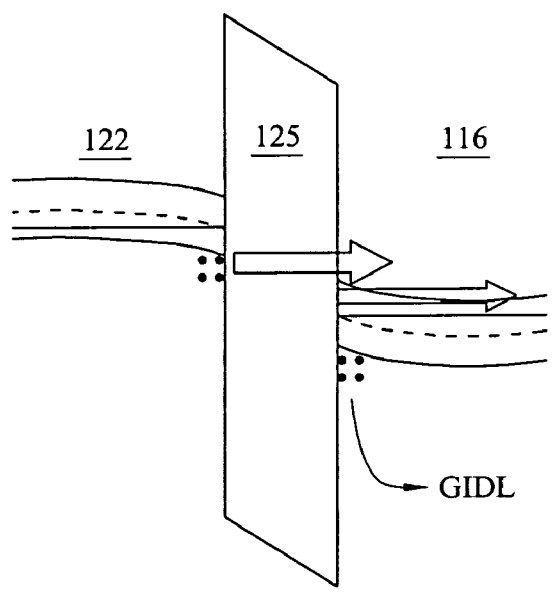

As illustrated in FIG. 4B, for a read "0" operation the inner surface 126 of the sidewall 116 and the side surface 128 of the poly structure 122 are in depletion. Valence band electrons in the poly structure 122 are excited into direct tunneling towards the n-type sidewall 116. Also, GIDL (hole) current is generated and flows toward the p-type substrate 110. As a result, the drain junction 108 (or bit line, not shown) senses a signal current pulse of large (hole) GIDL, which is interpreted as a "0".

Figure 5A:
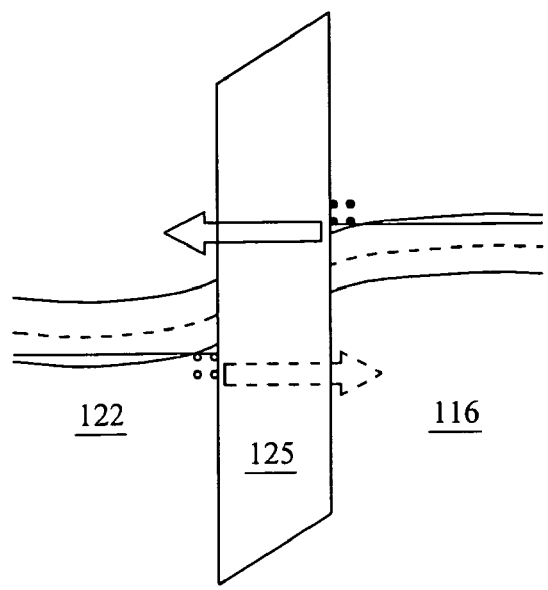
FIGS. 5A and 5B show energy band diagrams associated with charge retention of the memory cell shown in FIG. 1.
Figure 5B:
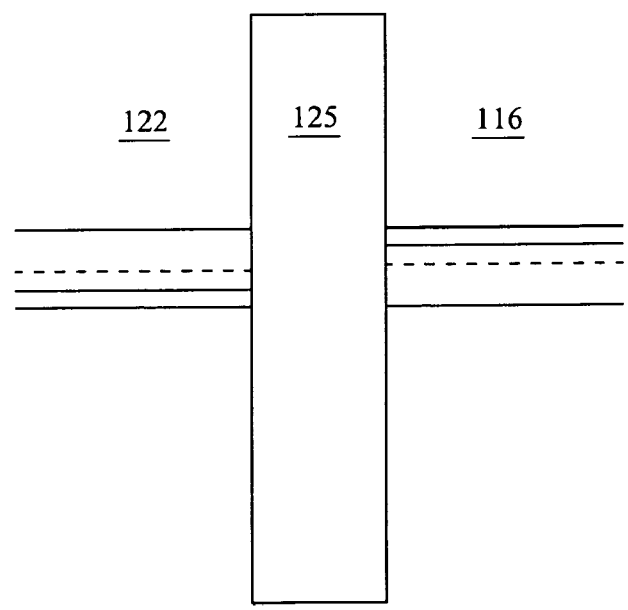

Charge retention of the memory cell 100 will now be discussed in connection with FIGS. 5A-5B. When the memory cell 100 is idling, the gate bias or potential on the gate structure 118 of the pass transistor 102 is biased to be slightly negative (e.g., −0.7 v). Note that the drain junction 108 (via a bit line, not shown) can be biased to 1.8 v, and therefore the negative gate bias is limited to −0.7v so that the maximum voltage across the 50 Å gate oxide layer 120 never exceeds 2.5 v. A worst-case (i.e., retention of "1") occurs when the potential of the p+ poly structure 122 is high. In this scenario, the n-type channel 106 is in depletion, but the inner surface 126 of the sidewall 116 is pulled towards electron accumulation by the positive potential of the poly structure 122. Thus, there will initially be some electron tunneling (as leakage) while the n-type sidewall 116 is accumulating electrons. During this period, the potential of the poly structure 122 is decreasing from 1.8 v until the sidewall 116 moves from accumulation (FIG. 5A) toward flat-band (FIG. 5B). The flat-band voltage ($V_{fb0}$) of the p+ poly structure 122 with respect to the n-type sidewall 116 is typically approximately 0.8 v if no adjacent negative bias (e.g., negative gate voltage $V_g$) is present. However, if the negative $V_g$ (e.g., −0.7 v) at the adjacent gate structure 118 is present, it will repel away electrons on the inner surface 126 of the sidewall 116. Therefore, the voltage potential of the poly structure 122 needs to be higher in order to maintain the flat-band at the inner surface 126 of the sidewall 116. Thus, the effective $V_{fb}$ with the presence of adjacent negative $V_g$ is higher by about the magnitude of $V_g$ (e.g., 0.8 v+0.7 v≈1.5 v). In other words, the potential of the poly structure 122 drops from its initial ~1.8 v to ~1.5 v, then the inner surface 126 of the sidewall 116 enters into the flat-band condition. After the n-type sidewall 116 is in a flat-band state with respect to the poly structure 122, the leakage due to electron tunneling from the inner surface 126 is significantly reduced and therefore the potential of the p+ poly structure 122 decreases very slowly and practically stays at approximately 1.5 v for a long time (e.g., approximately 10 seconds). As the potential of the poly structure 122 further decreases a little, then the inner surface 126 of the sidewall 116 becomes depletion, and this eliminates the electron tunneling current from the inner surface 126 of the sidewall 116. As a result of the above-described long retention mechanism and GIDL-assisted read operation, the cell capacitance does not need to be large (e.g., <1 fF) and cell layout can be minimized accordingly.

Fabrication of the memory cell 100 will now be discussed with reference to FIGS. 6A-6F. Beginning with FIG. 6A, a semiconductor substrate 110 (e.g., wafer) is provided. A layer of "pad" oxide (e.g., grown by oxidation) has been formed (e.g., thermally formed at 900° C.) on the upper surface of the substrate 110, and a silicon nitride layer has been deposited (e.g., by Low Pressure Chemical Vapor Deposition (LPCVD)) on the pad oxide. Note that in FIGS. 6A-6F the pad oxide and nitride layers are shown as a single layer L for simplicity. A deep narrow trench 114 (STI region) has been etched into the semiconductor substrate and substantially filled with a dielectric material (a portion of which will eventually become insulating layer 124) according to known methods (e.g. deposition of dielectric and followed by Chemical-mechanical polishing (CMP)).

Figure 6A:
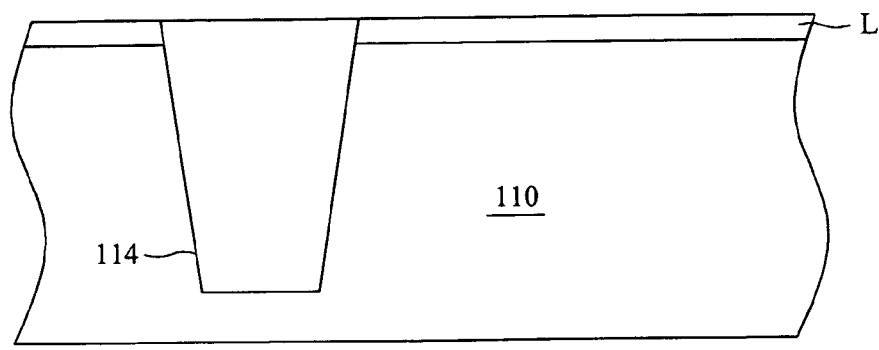
FIGS. 6A-6F show schematic cross-sectional views associated with a method of manufacturing the memory cell shown in FIG. 1.
Figure 6B:
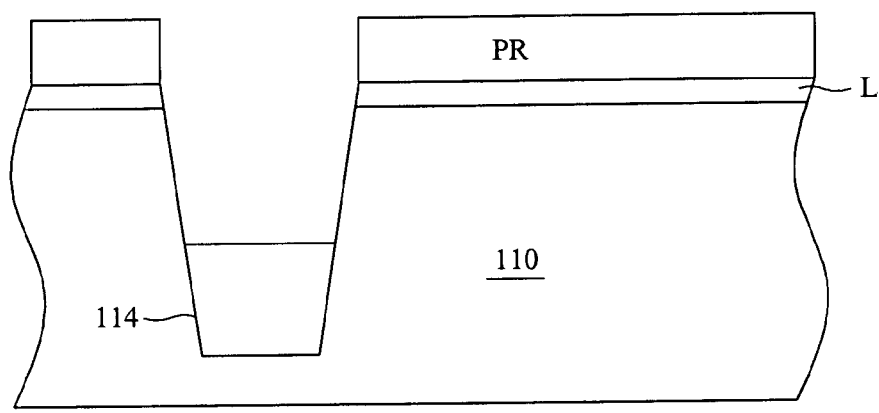
Figure 6C:
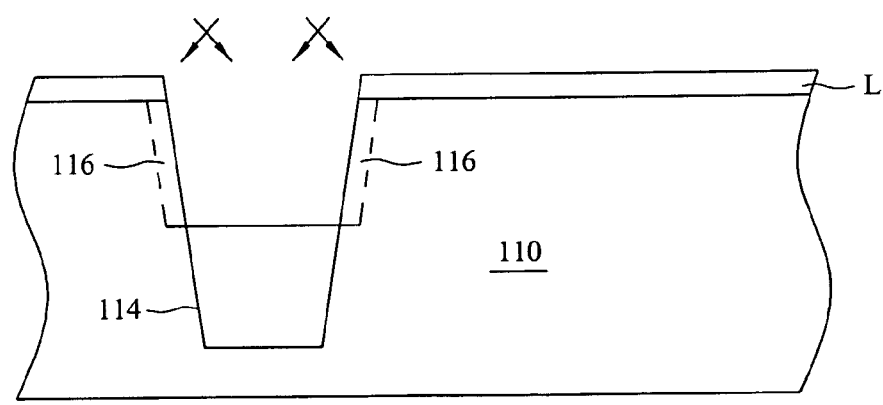
Figure 6D:
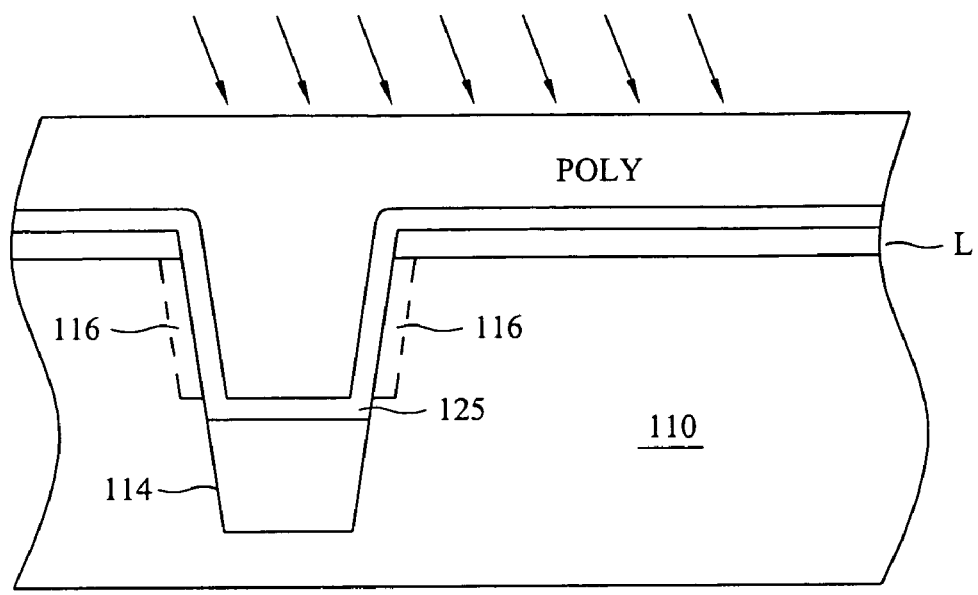
Figure 6E:
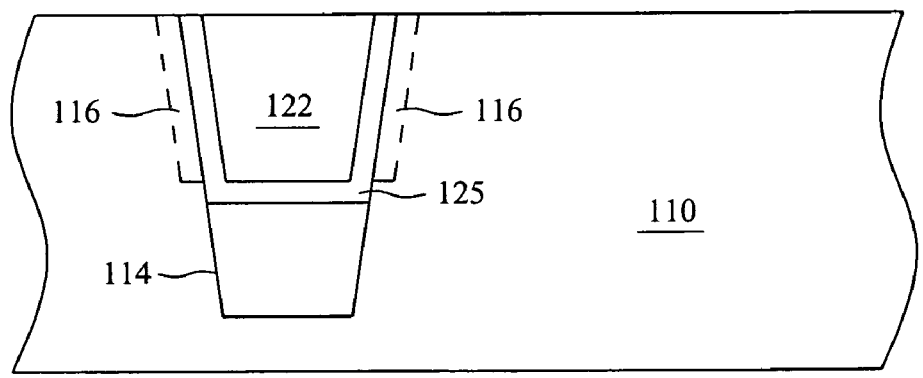
Figure 6F:
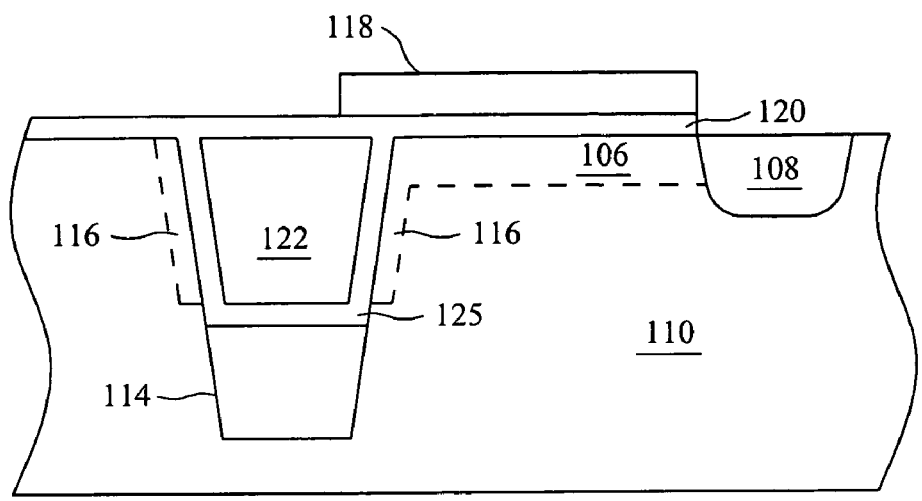

Next, in FIG. 6B a masking step is performed using a photoresist (PR) that is open to the trench 114. Oxide etching is then performed to recess the oxide in the trench 114, for example for approximately 1000 Å. Then, in FIG. 6C, after photoresist removal and cleaning, the sidewall 116 is formed by a side-wall implant process (n-type with dosage in the range of $1\times10^{13}$ to $1\times10^{16}$ atoms/cm$^3$, energy of approximately 5-20 Kev, large tilt-angle of 10° to 45° with 4 wafer rotations of 90°). Note that the wafer rotation during side-wall implant process can result in a continuous side-wall 116 around the poly structure 122 as shown (a top-view) in FIG. 2. The dielectric (tunneling oxide) layer 125 is then grown, followed by poly deposition (for beginning the formation of the poly structure 122) and implant doping as shown in FIG. 6D. Next, poly etch-back is performed as shown in FIG. 6E, thereby completing the formation of the poly structure 122. Then, as shown in FIG. 6F, the process of forming the memory cell 100 continues according to standard CMOS manufacturing flow, such as gate-ox growth, poly gate patterning, . . . etc.

Figure 7:
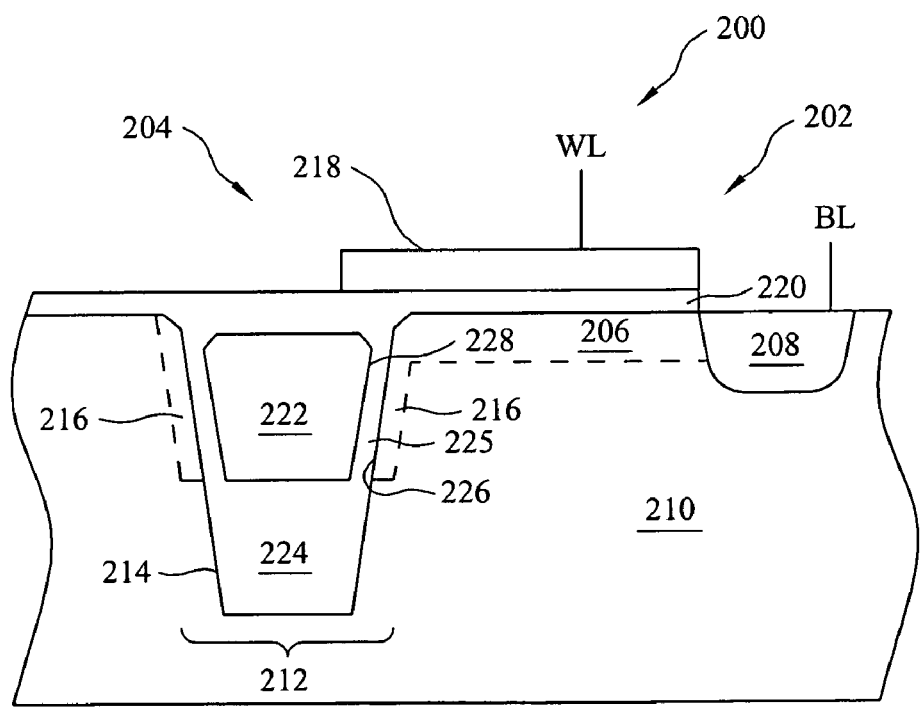
FIG. 7 shows a schematic cross-sectional view of a second embodiment of a DRAM memory cell.

Referring now to FIG. 7, a second embodiment will be described. FIG. 7 shows a memory cell 200, which has a structure that is similar to that of the memory cell 100, the most notable exception being that the conductivity types of components of the memory cell 200 are opposite those of corresponding components of the memory cell 100.

The memory cell 200 includes a PMOS pass-gate transistor 202 and a storage region 204. The transistor 202 includes an implanted p-type channel 206 and a p$^+$ drain junction 208 formed in an n-type substrate 210 (e.g., an n-type wafer or an n-well formed in a p-type wafer). The transistor 202 also includes a p$^+$ poly gate structure 218 and a gate-oxide layer 220.

The storage region 204 again includes an isolation region 212, which includes a trench 214 formed in the substrate 210. A n$^+$ poly (polysilicon) structure 222 is provided in the trench 214 over an insulating layer 224. The insulating layer 224 comprises silicon oxide, silicon nitride, silicon oxynitride or combinations thereof. A p-type implanted sidewall 216 wraps around the poly structure 222 and serves as the source junction of the PMOS transistor 202. An inner surface 226 of the sidewall 216 faces a side surface 228 of the poly structure 222 and partially defines the trench 214. The sidewall 216 preferably has a high enough impurity concentration, such as a concentration level typical of a drain extension of a Large-Angle Tilt Implanted Drain (LATID) structure, for example in a range of $1\times10^{16}$ atoms/cm$^3$ to $1\times10^{20}$ atoms/cm$^3$. The implanting of the sidewall 216 to be p-type results in enhanced GIDL electron current being induced on the inner surface 226 of the sidewall 216 by the potential of the n$^+$ poly structure 222 during read operations. A dielectric layer 225 is provided between the poly structure 222 and the sidewall 216. The dielectric layer 225 is a "tunnel oxide" and is preferably thin enough (e.g., <15 Å) for hole direct tunneling current during write operations.

As with the memory cell 100, the design rules and process parameters of typical CMOS 90 nm generation can advantageously be applied to the memory cell 200. Thus, the gate-oxide layer 220 preferably has a thickness of 50 Å for 2.5 v operations, 36 Å for 1.8 v operations, and 15 Å for 1.0 v operations. In addition, fabrication of the memory cell 200 can be similar to that of memory cell 100 described above in connection with FIGS. 6A-6F, except that the doping of the poly structure 222 and components of the pass transistor 202 are opposite that of corresponding structures of the memory cell 100. Therefore, the method of fabrication will not be repeated here.

The operations of write, read, and retention of memory 200 are also similar to memory 100. The differences are mainly due to the opposite conductivity type in memory cell 200. Thus, the substrate 210 is n-well and biased to highest potential (i.e. 2.5 v). The pass transistor is switched "on" when the gate 218 is biased to low (−0.7 v), and switched "off" to with gate biased to high (2.5 v). During charge retention, the pass gate is switched off. A worst-case occurs for retention of "0" when the potential of the n$^+$ poly structure 222 is low. As would be clear to those skilled in the art, the voltage bias for all operations of memory 200 is also in the opposite polarity than those for memory 100, and hence details of those operations are not repeated here for simplicity.

Figure 8:
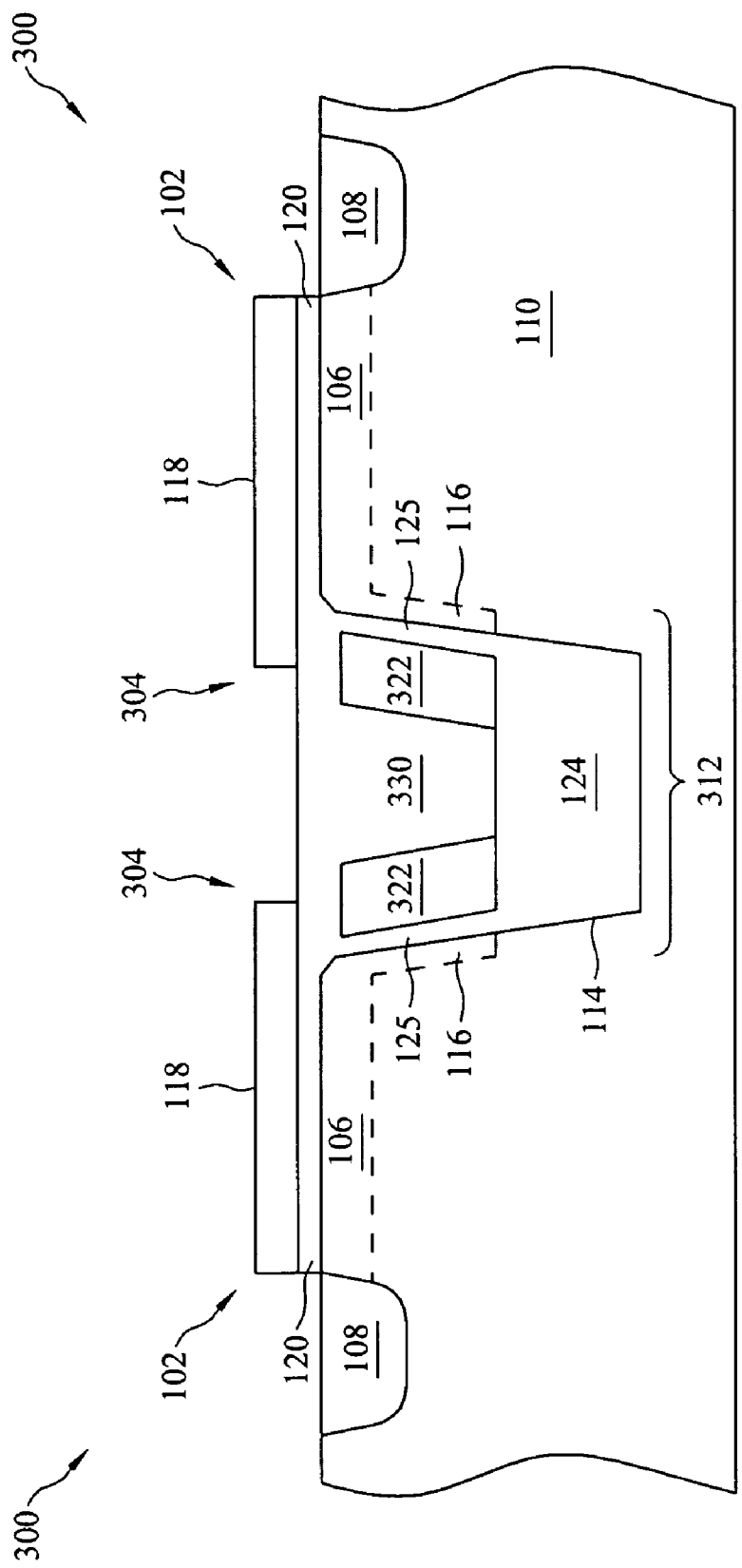
FIG. 8 shows a schematic cross-sectional view of a third embodiment of a DRAM memory cell.

Turning next to FIG. 8, a third embodiment will be described. FIG. 8 shows a pair of memory cells 300, each having a structure that is similar to that of the memory cell 100, the most notable exception being that each of the two memory cells 300 has a poly structure 322 that shares a common trench 114. Note that all elements of the neighboring cells, e.g. poly structure 322, side wall 116, and pass transistor 102, are separated physically and electrically. Thus, the cell size is further reduced in the third embodiment since neighboring memory cells 300 share a common trench 114. In addition, the write speed is enhanced due to smaller capacitances seen by each poly structure 322 in the trench 114.

In the illustrated embodiments, each of the memory cells 300 includes a pass transistor 102 comprising a n-type channel 106, an n-type sidewall 116, and a n$^+$ drain junction 108 formed in a p-type substrate 110, as well as a gate-oxide layer 120 and a n$^+$ poly gate structure 118 as described above in connection with FIG. 1.

Each of the memory cells 300 also includes a respective one of a pair of storage regions 304, which both share a common isolation region 312 (e.g., a partially recessed shallow trench isolation (STI)). The isolation region 312 includes a trench 114 formed in the substrate 110. A pair of p$^+$ poly (polysilicon) structures 322 (one for each of the memory cells 300) are provided in the trench 114 over an insulating layer 124. The pair of poly structures 322 are separated by an oxide plug 330 so as to be electrically isolated from each other (discussed in greater detail below). A dielectric layer 125 is provided between each poly structure 322 and its adjacent sidewall 116. The dielectric layer 125 is essentially a "tunnel oxide" that is preferably thin enough (e.g., <15 Å) to allow for large direct-tunneling current during write operations.

Figure 9:
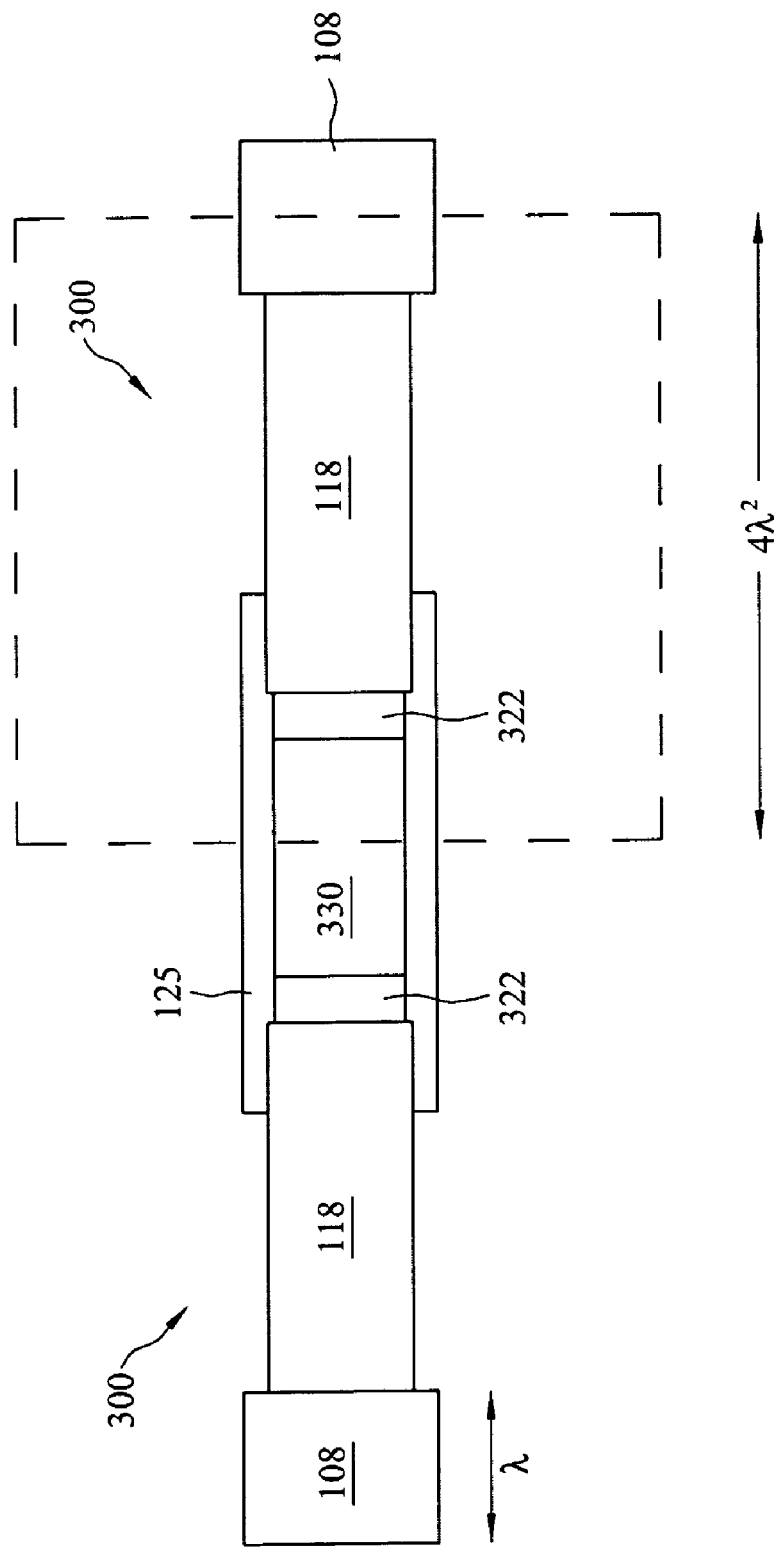
FIG. 9 shows a plan view of the memory cells shown in FIG. 8.

FIG. 9 shows a plan view of the memory cells 300. The layout of each memory cell 300 has a unit cell area of $4\lambda^2$, (50% of the conventional $8.0\lambda^2$ cell), where λ is the minimum lithography dimension. Thus, the cell size is further reduced by the present structure in which neighboring memory cells 300 share a common trench 114.

Figure 10A:
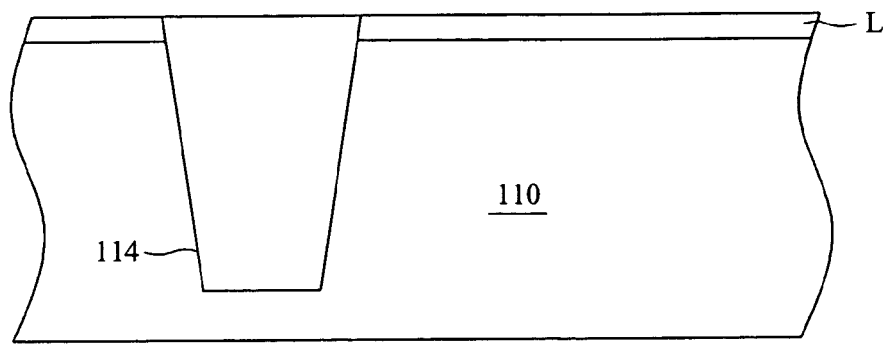
FIGS. 10A-10Q show schematic cross-sectional views associated with a method of manufacturing the memory cell shown in FIG. 8.
Figure 10B:
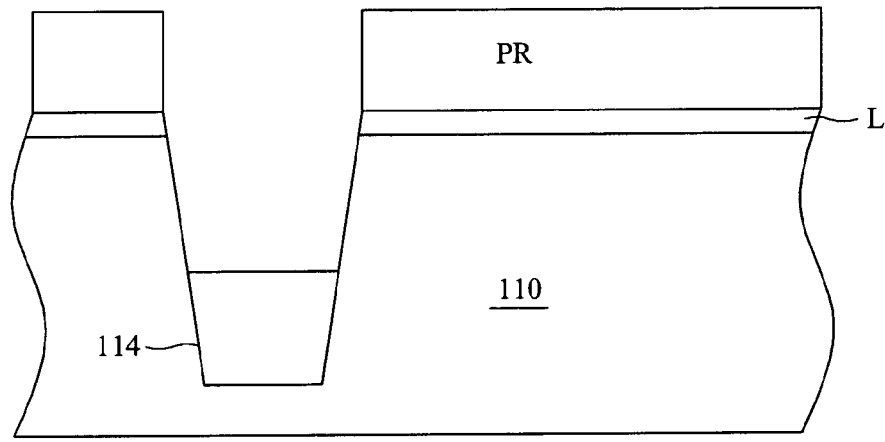
Figure 10C:
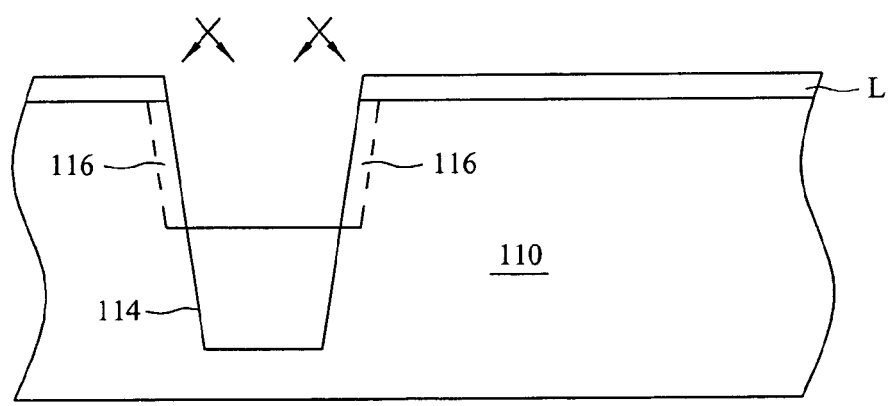
Figure 10D:
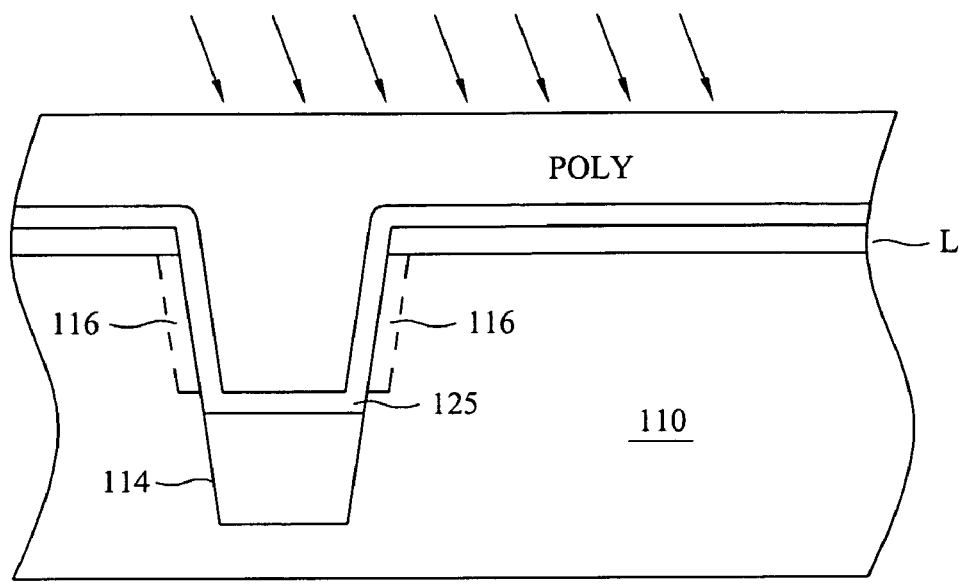
Figure 10E:
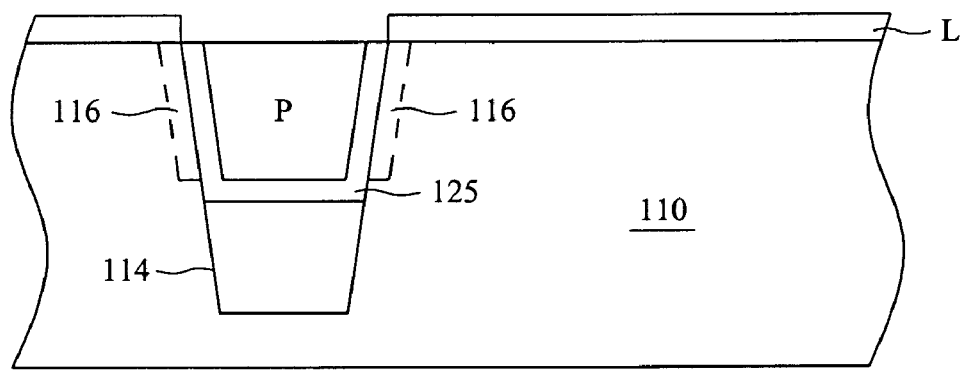

Fabrication of the memory cells 300 will now be described with reference to FIGS. 10A-10Q. Beginning with FIG. 10A, a semiconductor substrate 110 (e.g., wafer) is provided. A layer of "pad" oxide (e.g., grown by oxidation) has been formed (e.g., thermally formed at 900° C.) on the upper surface of the substrate 110, and a silicon nitride layer has been deposited (e.g., by Low Pressure Chemical Vapor Deposition (LPCVD)) on the pad oxide. Note that in FIGS. 10A-10O the pad oxide and nitride layers are shown as a single layer L for simplicity. A deep narrow trench 114 (STI region) has been etched into the semiconductor substrate and substantially filled with a dielectric material (a portion of which will eventually become insulating layer 124) according to known methods (e.g. deposition of dielectric and followed by CMP). Next, in FIG. 10B a masking step is performed using a photoresist (PR) that is open to the trench 114. An oxide etching is then performed to recess the oxide in the trench 114, for example for approximately 1000 Å. Then, in FIG. 10C, after PR removal and cleaning, the sidewall 116 is formed by a side-wall implant process (n-type with dosage in the range of $1\times10^{13}$ to $1\times10^{16}$ atoms/cm$^3$, energy of approximately 5-20 Kev, large tilt-angle of 10° to 45° with 2 wafer rotations of 180°). Note that the 2 steps of 180° wafer rotation during side-wall implant process can result in separated sidewall 116 facing to poly structure 322 for each neighboring cell 300 respectively as shown in FIG. 8. The dielectric (tunneling oxide) layer 125 is then grown, followed by deposition of poly P (to be later formed into the poly structures 322) and implant doping as shown in FIG. 10D. A poly etch-back is then performed as shown in FIG. 10E, leaving the pad oxide/nitride layer L over the NMOS active area while exposing the poly P.

Figure 10F:
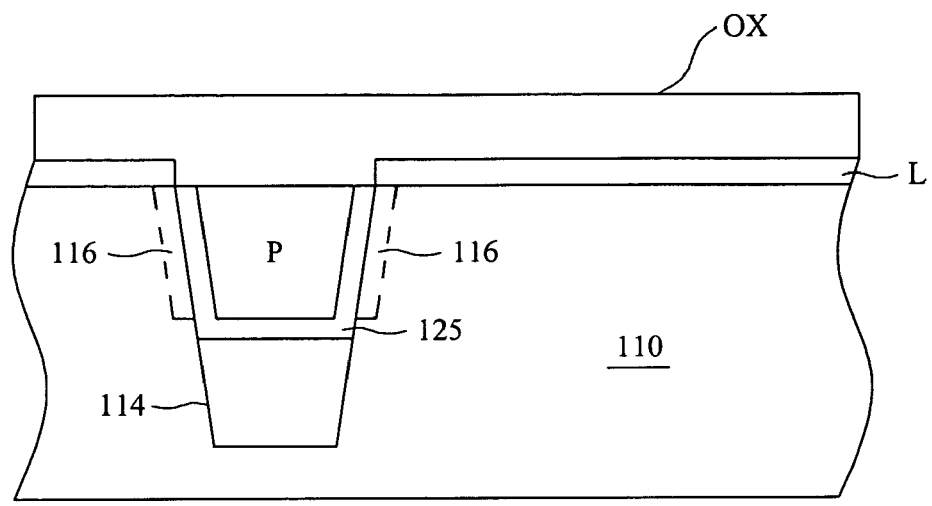
Figure 10G:
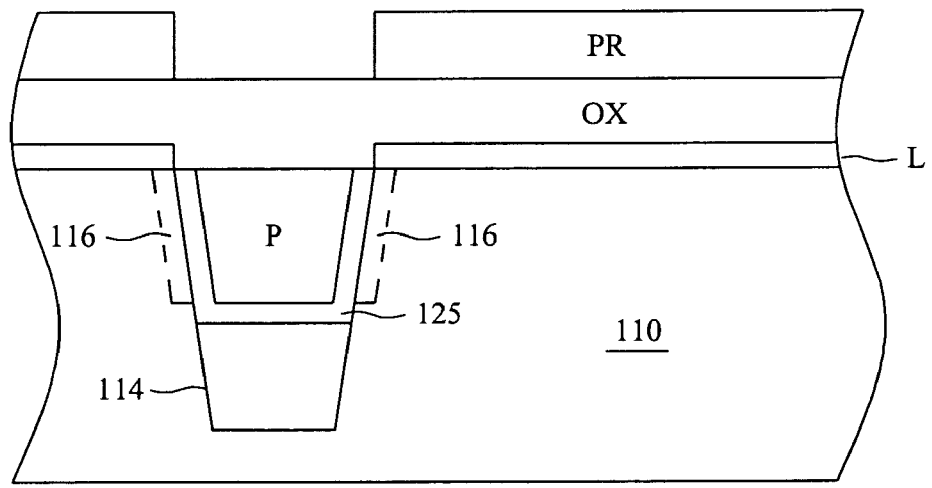
Figure 10H:
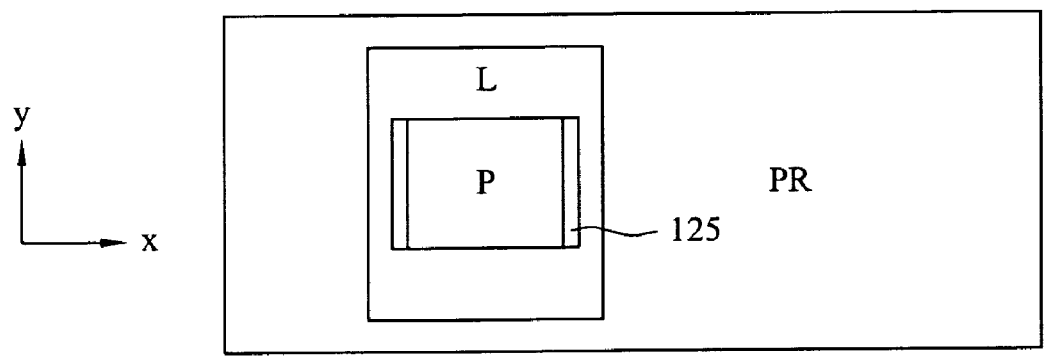
Figure 10I:
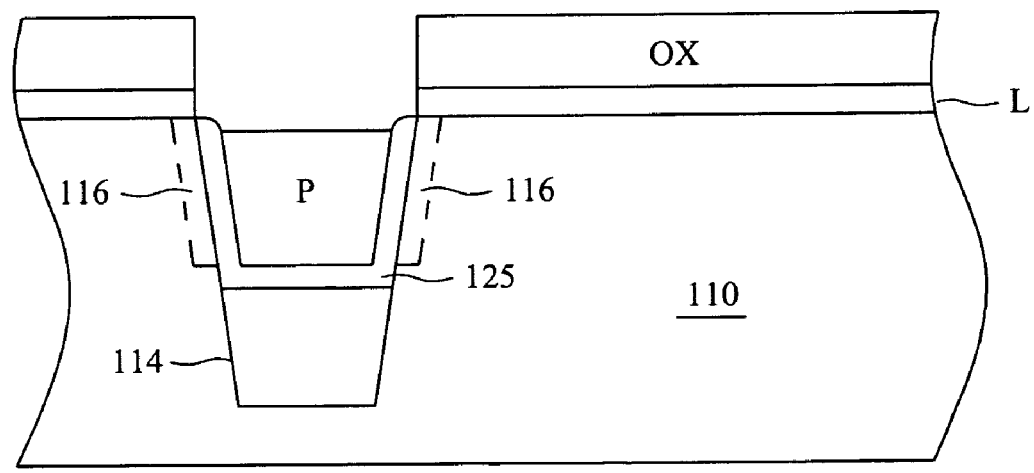
Figure 10J:
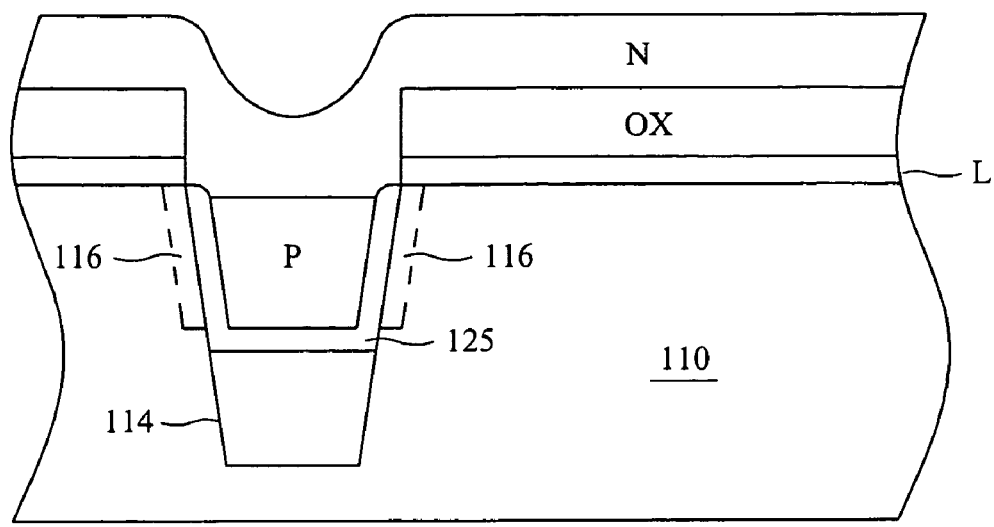
Figure 10K:
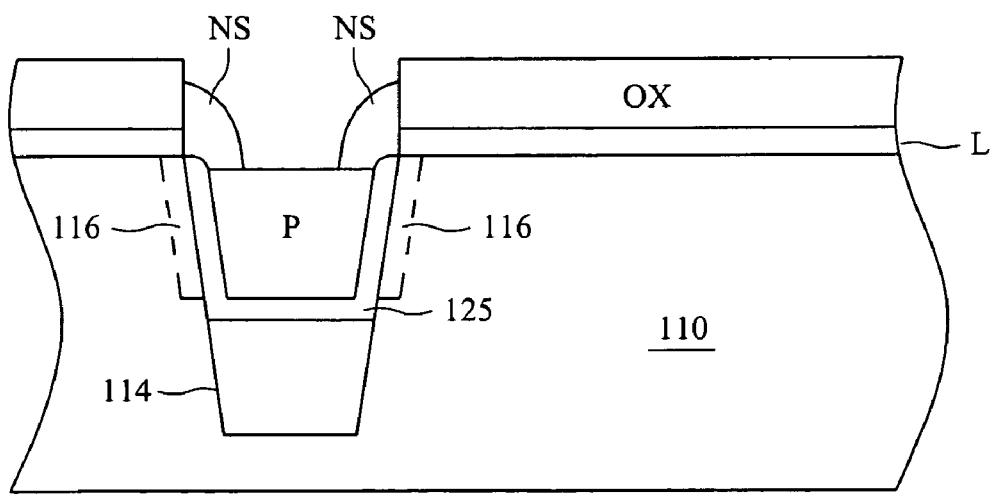
Figure 10L:
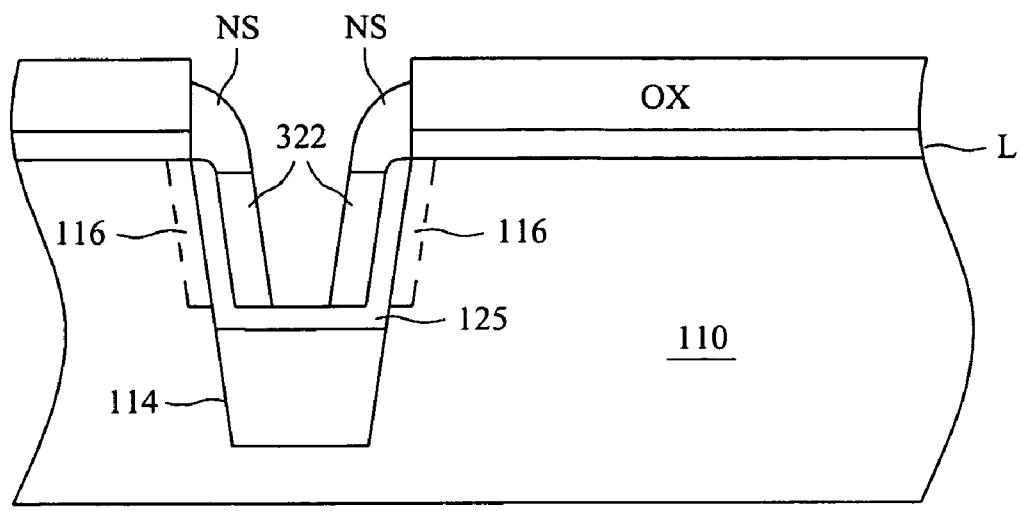
Figure 10M:
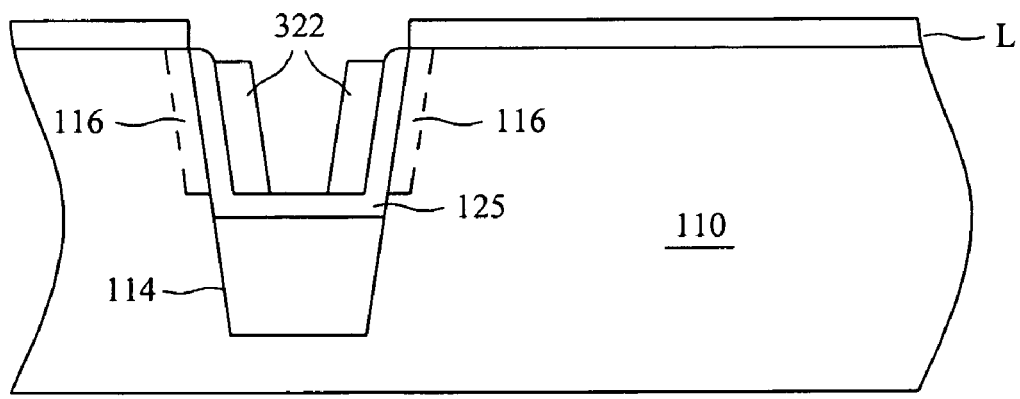

Next, a layer of oxide OX (200 Å to 400 Å) is deposited as shown in FIG. 10F. A masking step is then performed as shown in FIGS. 10G and 10H. The masking step is for opening an area of the oxide layer OX in the vicinity of the trench 114 (STI). FIG. 10H shows a plan view of the opening portion of the PR layer in the vicinity of the trench 114. Note that the mask formed by the PR layer shall open to the trench 114 area with a larger dimension in the y-direction as depicted in FIG. 10H (for reasons that will become clear in view of the description below). Next, an oxide etching step is performed (stopping on the nitride L of the active area) until the surface of the poly P in the trench 114 is exposed as shown in FIG. 10I. Then, nitride spacers NS are formed by deposition of a nitride layer N (200 Å to 400 Å) as shown in FIG. 10J and etching (stopping on the surface of the poly P) as shown in FIG. 10K. The nitride spacers NS will overlap on the poly P in the x-direction and (as desirable) on the upper surface of the nitride layer L in the y-direction (x- and y-directions being as defined in FIG. 10H) due to the configuration of the mask shown in FIG. 10H. The nitride spacers NS serve as a hard mask for poly etching for forming the poly structures 322 of neighboring memory cells 300 as shown in FIG. 10L. Next, the nitride spacers NS and the oxide layer OX are removed as shown in FIG. 10M.

As a result of the manufacturing steps shown in FIGS. 10G-10M, the poly structures 322 are formed only along sides (facing the x-direction) of the trench 114 facing respective pass transistors 102, while none of the original poly P remains along the sides of the trench 114 that face the y-direction. Therefore, the poly structures 322 are electrically isolated from each other. Therefore, with the disclosed process steps, the mask in FIG. 10H is designed with wider opening in y direction (than in x-direction) by about 2× of the width of nitride spacer NS.

Figure 10N:
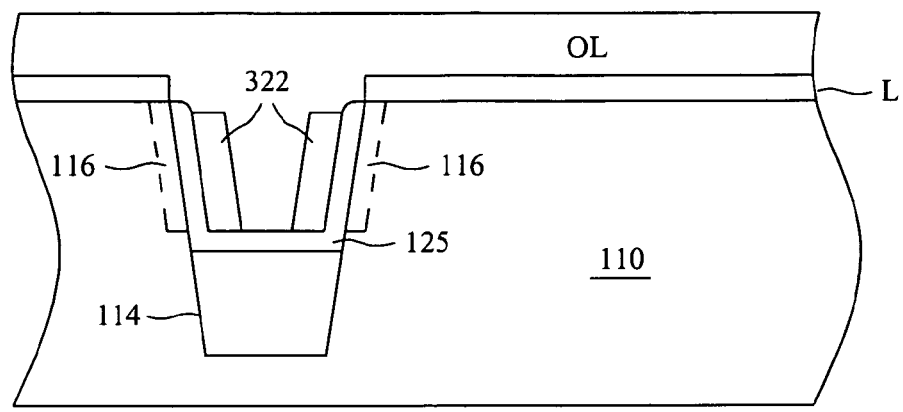
Figure 10O:
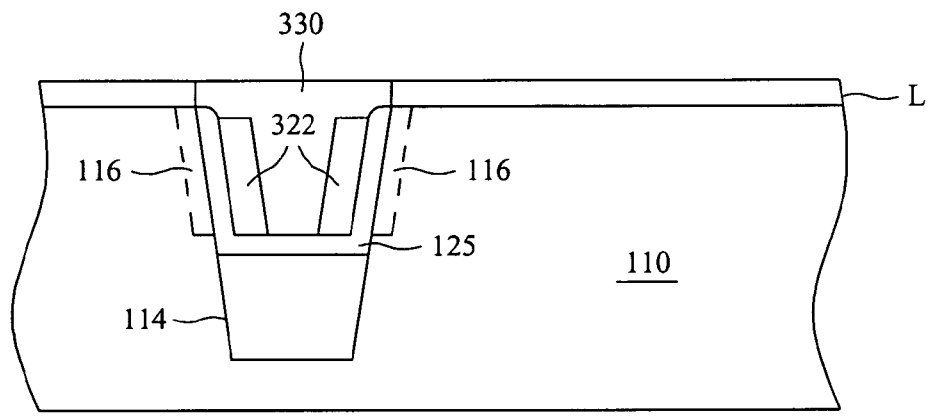
Figure 10P:
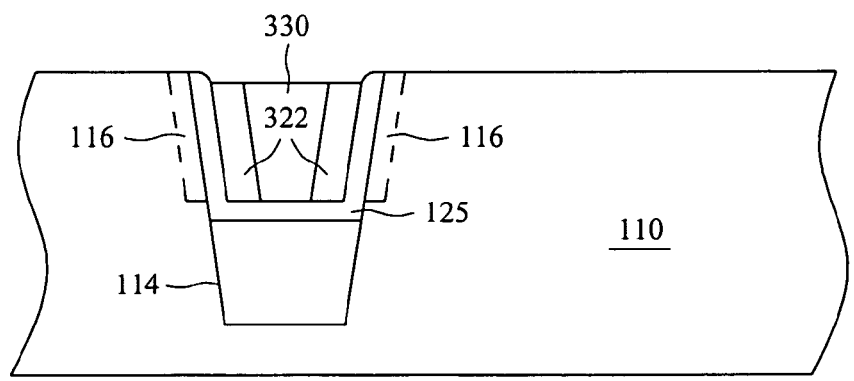
Figure 10Q:
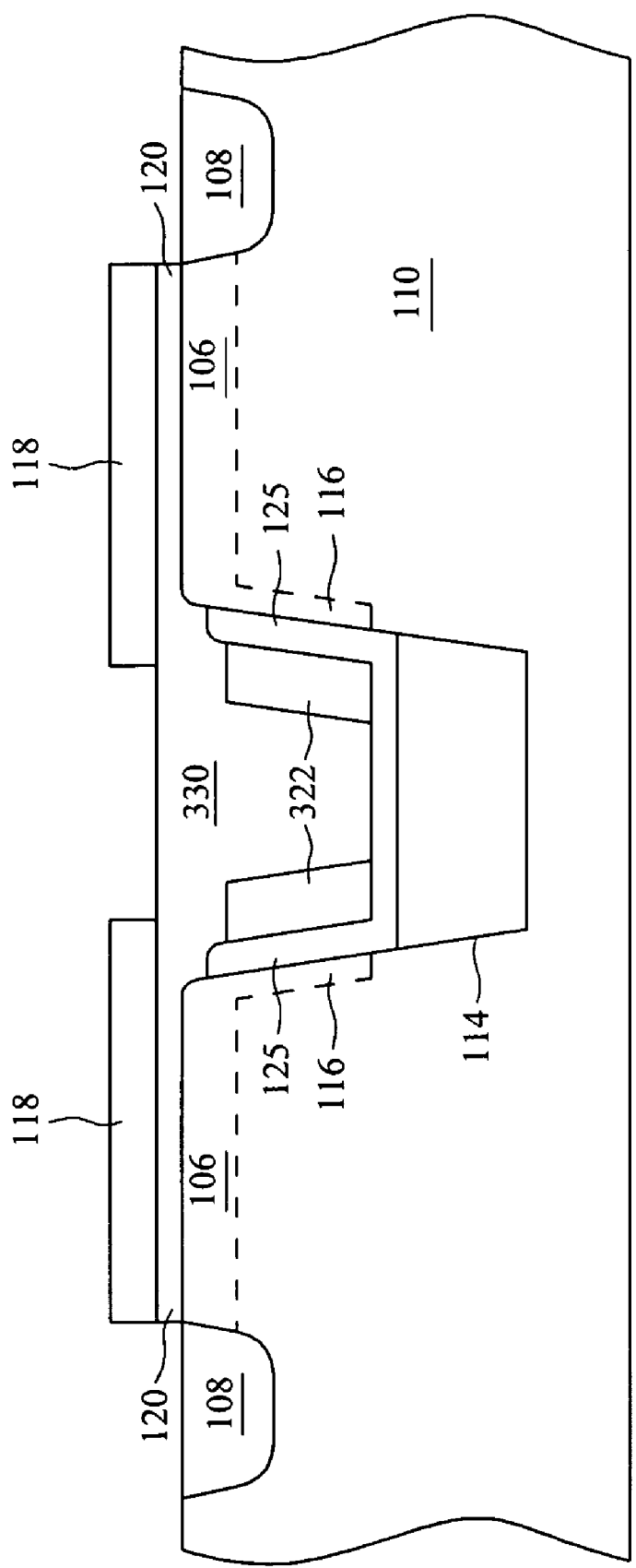

Next, an oxide is deposited, for example by CVD, to fill the trench 114, overfilling so as to form an oxide liner OL as shown in FIG. 10N. This is followed by removal of excess portions (oxide liner OL/trench overfill) of the oxide to form the oxide plug 330 by a process such as Chemical Mechanical Polishing (CMP) as shown in FIG. 10O. Then, in FIG. 10P, the nitride is removed, for example by a wet nitride etch in hot phosphoric acid and/or dry nitride etch in NF$_3$/Ar/NO. Then, as shown in FIG. 10Q, the process of forming the memory cells 300 continues according to standard CMOS manufacturing flow, such as gate-ox growth, poly gate patterning, . . . etc.

Still further embodiments of the present memory cell are contemplated. For example, the third embodiment could be modified such that the memory cells 300 can include PMOS pass transistors rather than NMOS pass transistors. Such an embodiment would differ from the third embodiment as the second embodiment differs from the first embodiment.

The operations of write, read, and retention for memory cell 300 with either n-type or p-type pass transistor are the same as those for memory 100 or 200 respectively. Thus, they are not repeated here for simplicity.

Referring back to FIG. 1, it is also contemplated that the first embodiment can be modified such that the poly structure 122 can be formed of other non-insulating materials (e.g., semiconductive or conductive materials). For example, the poly structure 122 can be formed of a conductive material (rather than semiconductive polysilicon) such as a conductive metal, metal-silicide, or metal-nitride. In addition, the dielectric layer 125 can be formed of a high-k dielectric material. A dielectric layer 125 composed of a high-k dielectric material can offer significantly superior cell performance by providing for lower tunneling barrier energy (for faster write operations (e.g., <1 ns)) as well as providing for reduced leakage (for longer retention times) at an equivalent oxide thickness (EOT). A conductive version of the poly structure 122 can provide for lower voltage operations due to its Fertni level being about in the mid-gap of silicon, (e.g., $V_{dd2}$~1.8 v, $V_{dd1}$~1.2 v, and $V_{cc}$~0.8 v for 45 mm CMOS generation technology). As previously described in prior embodiments, the third embodiment can be similarly modified to replace the poly structures 322 with conductive material and use a high-k dielectric for the dielectric layer 125. In this embodiment, the conductive material is preferably a metal silicide that includes at least one of cobalt (Co), titanium (Ti), nickel (Ni), palladium (Pd), platinum (Pt), chromium (Cr), molybdenum (Mo), tantalum (Ta), and tungsten (W). Alternatively, the conductive material can be a metal nitride or a metal oxynitride that includes at least one of cobalt (Co), titanium (Ti), nickel (Ni), palladium (Pd), platinum (Pt), chromium (Cr), molybdenum (Mo), tantalum (Ta), and tungsten (W). Examples of preferable high-k dielectric materials that can be used include silicon nitride ($Si_3N_4$), alumina ($Al_2O_3$), hafniium oxide ($HfO_2$), although it is contemplated that the use of other dielectrics is possible (e.g., depending on thermal stability requirements) such as hafnium silicate ($HfSiO_4$), zirconium oxide ($ZrO_2$), zirconium silicate ($ZrSiO_4$), tantalum pentoxide ($Ta_2$—$O_5$), lanthanum oxide ($La_2O_3$), gadolinium oxide ($Gd_3O_3$), yttrium oxide ($Y_2O_3$), and strontium titanate ($SrTiO_3$).

The present memory cell can also be used as a flash memory cell by providing a thicker dielectric layer 125 (e.g., 80-100 Å EOT). However, this would require a higher operating voltage, e.g., 10-12 v, for writing operations using F-N tunneling (rather than direct tunneling with the thinner dielectric layer 125). On the other hand, the thicker dielectric layer 125 would reduce leakage current, thereby providing for an increased retention time, e.g., 10 years. The read operation can be similar, also using GIDL current as the cell current. Since the read operation is non-destructive, no write-back operation would be necessary. It will be appreciated that the third embodiment could be similarly modified.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory cell comprising:
a semiconductor substrate;
an isolation region in the semiconductor substrate, wherein the isolation region includes a trench that extends into the semiconductor substrate;
a sidewall implanted to a first conductivity type within sides of the trench thereby substantially circumscribing the trench, the substrate substantially circumscribing the sidewall and having a second conductivity type different than the first conductivity type;
an at least semiconductive structure of a second conductivity type within the trench of the isolation region;
a dielectric layer disposed on all sides within the trench between the at least semiconductive structure and the sidewall; and
a gate structure directly vertically above at least a portion of the sidewall and the at least semiconductive structure, and extending laterally on the semiconductor substrate to define a channel region of the first conductivity type in the substrate horizontally adjacent to and in direct electrical contact with the sidewall, the dielectric layer electrically insulating the at least semiconductive structure from the channel region.

2. A memory cell according to claim 1, wherein the gate structure includes a metal.

3. A memory cell according to claim 1, wherein the gate structure includes polysilicon.

4. A memory cell according to claim 1, wherein the at least semiconductive structure includes doped silicon.

5. A memory cell according to claim 4, wherein said doped silicon is of a first conductivity type, and wherein the gate structure is of a second conductivity type opposite to the first conductivity type.

6. A memory cell according to claim 5, wherein the first conductivity type is p-type and the second conductivity type is n-type.

7. A memory cell according to claim 1, wherein the dielectric layer has a thickness in a range of 5 to 50 angstroms.

8. A memory cell according to claim 7, wherein the dielectric layer includes a high-k material selected from a group consisting of silicon nitride ($Si_3N_4$), alumina ($Al_2O_3$), hafnium oxide ($HfO_2$), hafnium silicate ($HfSiO_4$), zirconium oxide ($ZrO_2$), zirconium silicate ($ZrSiO_4$), tantalum pentoxide ($Ta_3O_5$), lanthanum oxide ($La_2O_3$), gadolinium oxide ($Gd_3O_3$), yttrium oxide ($Y_2O_3$), and strontium titanate ($SrTiO_3$).

9. A memory cell according to claim 7, wherein the dielectric layer includes an oxide.

10. A memory cell according to claim 1, wherein the at least semiconductive structure has an upper surface and the semiconductor substrate has an upper surface, wherein the upper surface of the at least semiconductive structure is below the upper surface of the semiconductor substrate.

11. A memory cell according to claim 1, wherein the gate structure extends above at least a portion of the at least semiconductive structure.

12. A memory cell according to claim 1, wherein the at least semiconductive structure is a conductive structure.

13. A memory cell according to claim 12, wherein the conductive structure includes metal or metal alloy.

14. A memory cell according to claim 12, wherein the conductive structure includes a metal silicide.

15. A memory cell according to claim 14, wherein the metal in the metal silicide is selected from the group consisting of cobalt (Co), titanium (Ti), nickel (Ni), palladium (Pd), platinum (Pt), chromium (Cr), molybdenum (Mo), tantalum (Ta), and tungsten (W).

16. A memory cell according to claim 12, wherein the conductive structure includes a material selected from the group consisting of metal nitride, metal silicide, and metal oxynitride.

17. A memory cell according to claim 16, wherein the conductive structure includes at least one of cobalt (Co), titanium (Ti), nickel (Ni), palladium (Pd), platinum (Pt), chromium (Cr), molybdenum (Mo), tantalum (Ta), and tungsten (W).

* * * * *